United States Patent
van Dal et al.

(10) Patent No.: US 9,991,169 B2
(45) Date of Patent: Jun. 5, 2018

(54) SEMICONDUCTOR DEVICE AND FORMATION THEREOF

(71) Applicant: Taiwan Semiconductor Manufacturing Company Limited, Hsin-Chu (TW)

(72) Inventors: Mark van Dal, Linden (BE); Blandine Duriez, Brussels (BE)

(73) Assignee: TAIWAN SEMICONDUCTOR MANUFACTURING COMPANY LIMITED, Hsin-Chu (TW)

(*) Notice: Subject to any disclaimer, the term of this patent is extended or adjusted under 35 U.S.C. 154(b) by 0 days. days.

(21) Appl. No.: 15/270,207

(22) Filed: Sep. 20, 2016

(65) Prior Publication Data

US 2017/0033014 A1 Feb. 2, 2017

Related U.S. Application Data

(62) Division of application No. 14/249,397, filed on Apr. 10, 2014, now Pat. No. 9,450,096.

(51) Int. Cl.
*H01L 21/8234* (2006.01)
*H01L 29/78* (2006.01)
*H01L 29/66* (2006.01)
(Continued)

(52) U.S. Cl.
CPC .. *H01L 21/823431* (2013.01); *H01L 21/3065* (2013.01); *H01L 21/823412* (2013.01);
(Continued)

(58) Field of Classification Search
CPC .......... H01L 21/823431; H01L 29/785; H01L 29/66545; H01L 29/66795; H01L 29/7853;
(Continued)

(56) References Cited

U.S. PATENT DOCUMENTS 8,062,963 B1 11/2011 Van Dal
8,722,520 B2 5/2014 Van Dal
(Continued)

OTHER PUBLICATIONS

Duriez, et al., "Scaled p-channel Ge FinFET with optimized gate stack and record performance integrated on 300mm Si wafers", 978-1-4799-2306-9/13/$31.00 ©2013 IEEE, http://ieeexplore.ieee.org/cart/download.jsp?partnum=6724666 &searchProductType=IEEE%20Conferences, pp. 522-525.
(Continued)

*Primary Examiner* — Long Pham
(74) *Attorney, Agent, or Firm* — Cooper Legal Group, LLC

(57) ABSTRACT

A semiconductor device and methods of formation are provided. The semiconductor device includes a first active region having a first active region height and an active channel region having an active channel region height over a fin. The first active region height is greater than the active channel region height. The active channel region having the active channel region height has increased strain, such as increased tensile strain, as compared to an active channel region that has a height greater than the active channel region height. The increased strain increases or enhances at least one of hole mobility or electron mobility in at least one of the first active region or the active channel region. The active channel region having the active channel region height has decreased source drain leakage, as compared to an active channel region that has a height greater than the active channel region height.

21 Claims, 13 Drawing Sheets

(51) Int. Cl.
*H01L 29/10* (2006.01)
*H01L 21/3065* (2006.01)

(52) U.S. Cl.
CPC ........... *H01L 21/823437* (2013.01); *H01L 21/823462* (2013.01); *H01L 29/1037* (2013.01); *H01L 29/1054* (2013.01); *H01L 29/66545* (2013.01); *H01L 29/66795* (2013.01); *H01L 29/785* (2013.01); *H01L 29/7853* (2013.01)

(58) Field of Classification Search
CPC ............. H01L 29/1054; H01L 21/3065; H01L 21/823412; H01L 21/823437; H01L 21/823462; H01L 29/1037
See application file for complete search history.

(56) References Cited

U.S. PATENT DOCUMENTS

2012/0319211 A1  12/2012  Van Dal et al.
2014/0239347 A1  8/2014  van Dal

OTHER PUBLICATIONS

Van Dal, et al., "Demonstration of scaled Ge p-channel FinFETs integrated on Si", Electron Devices Meeting (IEDM), 2012 IEEE International, Dec. 10-13, 2012, http://ieeexplore.ieee.org/xpl/login.jsp?tp=&arnumber=6479089&url=http%3A%2F%2Fieeexplore.ieee.org%2Fiel7%2F6471855%2F6478950%2F06479089.pdf%3Farnumber%3D6479089, pp. 1-5.

SEMICONDUCTOR DEVICE AND FORMATION THEREOF

RELATED APPLICATION

This application is a divisional of and claims priority to U.S. patent application Ser. No. 14/249,397, titled "SEMICONDUCTOR DEVICE AND FORMATION THEREOF" and filed on Apr. 10, 2014, which is incorporated herein by reference.

BACKGROUND

In a semiconductor device, such as a transistor, current flows through a channel region between a source region and a drain region upon application of a sufficient voltage or bias to a gate of the device. When current flows through the channel region, the transistor is generally regarded as being in an 'on' state, and when current is not flowing through the channel region, the transistor is generally regarded as being in an 'off' state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
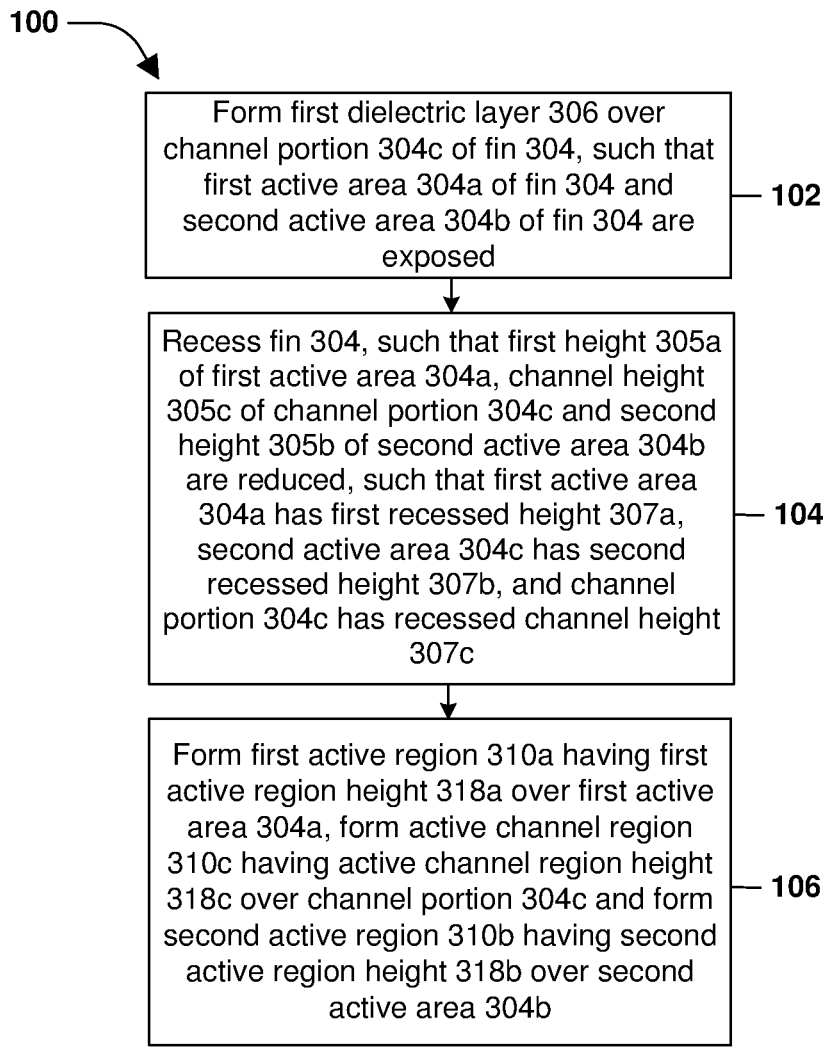
FIG. 1 is a flow diagram illustrating a method of forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor device and resulting structures formed thereby are provided herein.

Figure 2:
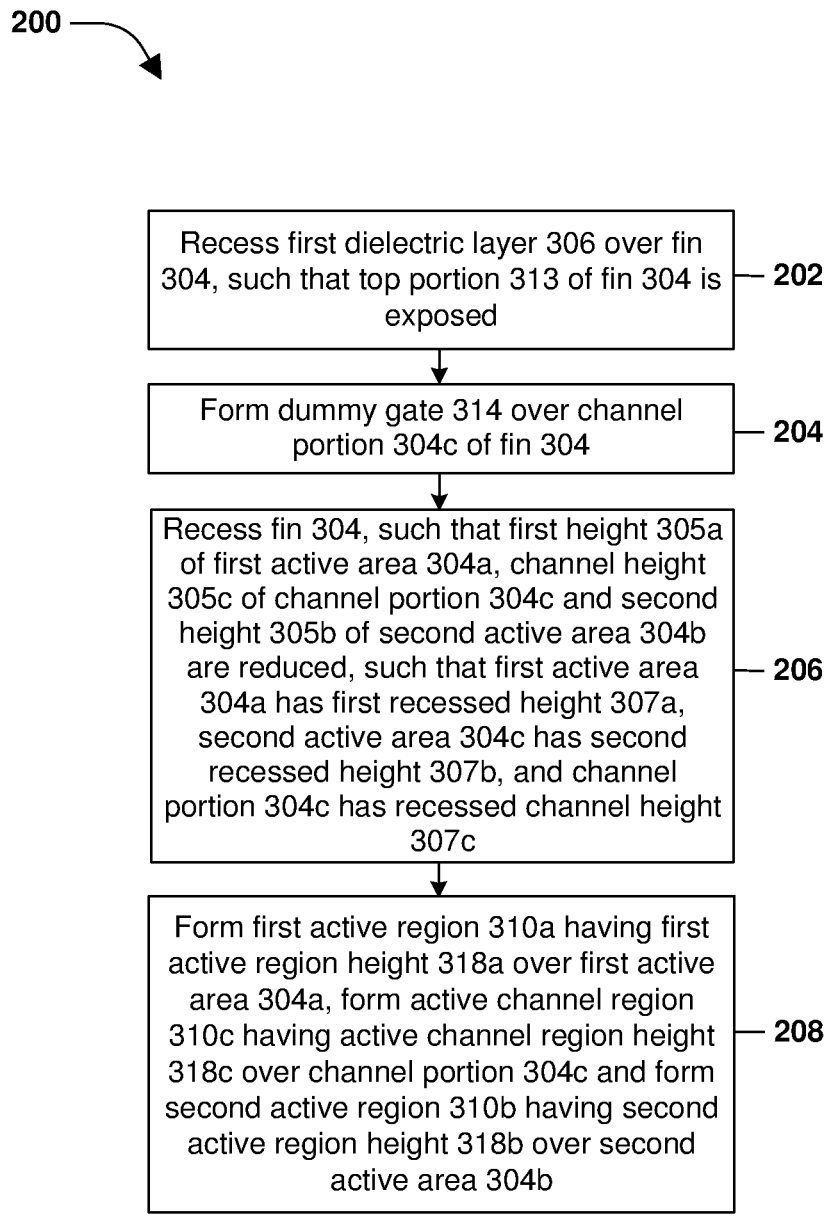
FIG. 2 is a flow diagram illustrating a method of forming a semiconductor device, in accordance with some embodiments.
Figure 15:
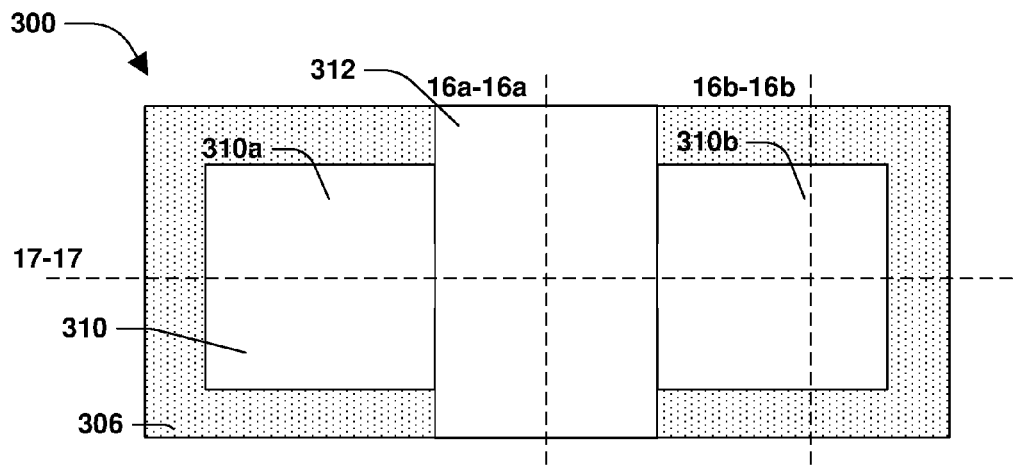
FIG. 15 is an illustration of a semiconductor device, in accordance with some embodiments.
Figures 16A, 16B:
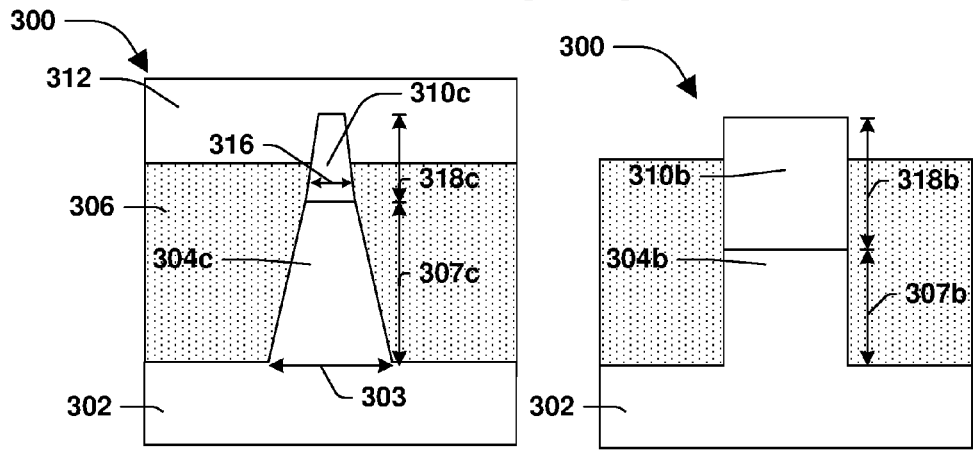
FIG. 16A is an illustration of a semiconductor device, in accordance with some embodiments.
FIG. 16B is an illustration of a semiconductor device, in accordance with some embodiments.
Figure 17:
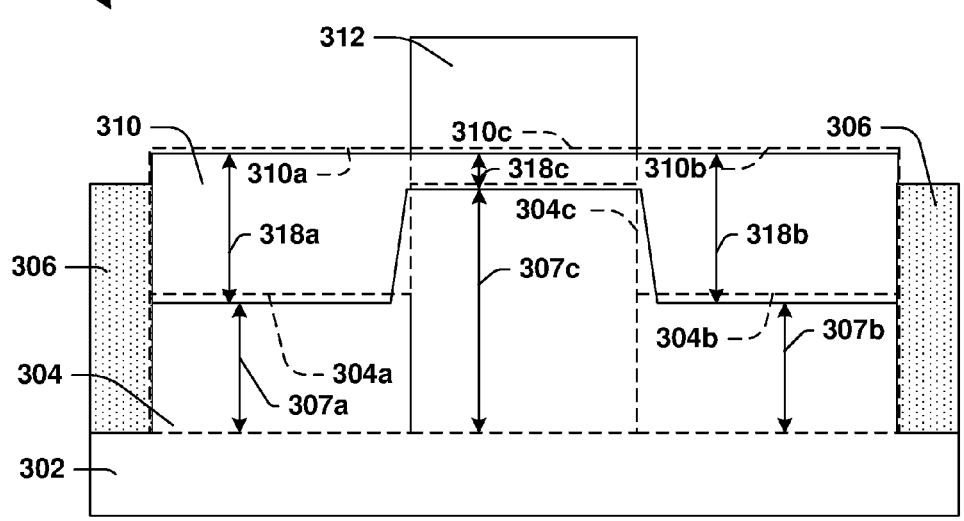
FIG. 17 is an illustration of a semiconductor device, in accordance with some embodiments.
Figure 33:
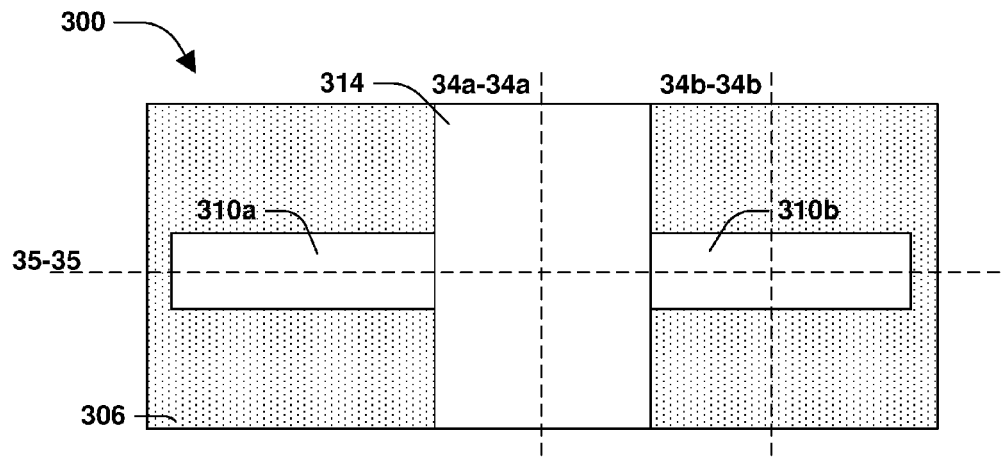
FIG. 33 is an illustration of a semiconductor device, in accordance with some embodiments.
Figures 34A, 34B:
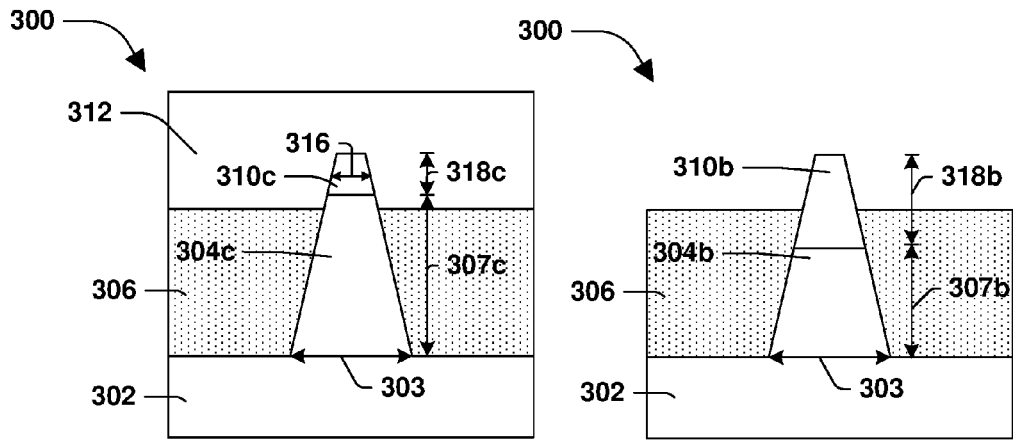
FIG. 34A is an illustration of a semiconductor device, in accordance with some embodiments.
FIG. 34B is an illustration of a semiconductor device, in accordance with some embodiments.
Figure 35:
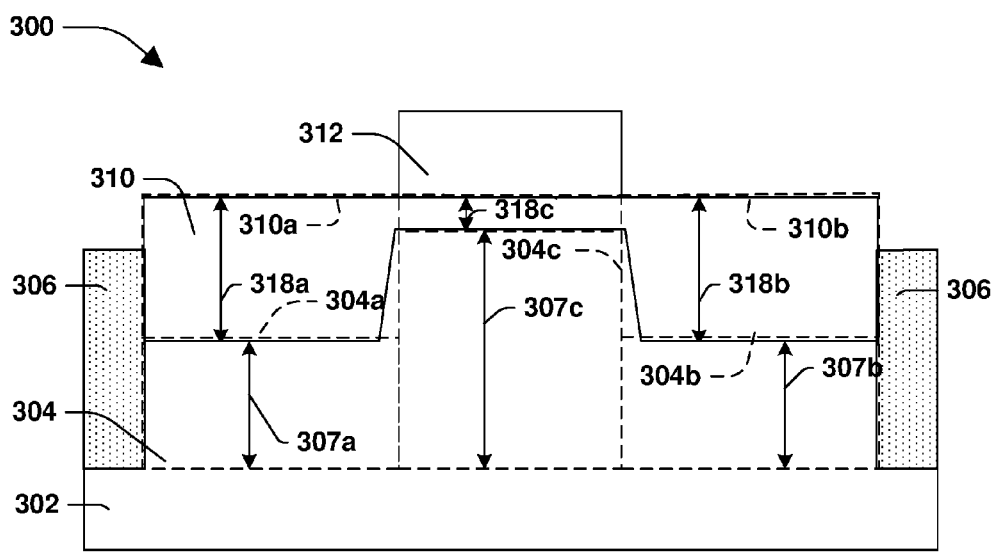
FIG. 35 is an illustration of a semiconductor device, in accordance with some embodiments.

A first method 100 of forming a semiconductor device 300 is illustrated in FIG. 1, and one or more semiconductor devices formed by such methodology are illustrated in FIGS. 3-17. A second method 200 of forming the semiconductor device 300 is illustrated in FIG. 2, and one or more semiconductor devices formed by such methodology are illustrated in FIGS. 18-35. In some embodiments, such as illustrated in FIGS. 15, 16A, 16B, and 17 as formed by the first method 100 and FIGS. 33, 34A, 34B and 35 as formed by the second method 200, FIGS. 15 and 33 illustrate an overview or top down view of the semiconductor device 300, FIGS. 16A and 34A illustrate a cross sectional view of the semiconductor device 300 taken along lines 16a-16a, and 34a-34a respectively, FIGS. 16B and 34B illustrate a cross sectional view of the semiconductor device 300 taken along lines 16b-16b, and 34b-34b respectively and FIGS. 17 and 35 illustrate a cross sectional view of the semiconductor device 300 taken along lines 17-17, and 35-35 respectively. In some embodiments, the semiconductor device 300 comprises a fin 304 having a first active area 304a, a channel portion 304c and a second active area 304b, where the first active area 304a has a first recessed height 307a, the channel portion 304c has a recessed channel height 307c and the second active area 304b has a second recessed height 307b. In some embodiments, the recessed channel height 307c is greater than at least one of the first recessed height 307a or the second recessed height 307b. In some embodiments, a first active region 310a is over the first active area 304a. In some embodiments, the first active region 310a has a first active region height 318a. In some embodiments, an active channel region 310c is over the channel portion 304c. In some embodiments, the active channel region 310c has an active channel region height 318c. In some embodiments, a second active region 310b is over the second active area 304b. In some embodiments, the second active region 310b has a second active region height 318b. In some embodiments, at least one of the first active region height 318a or the second active region height 318b is greater than the active channel region height 318c. In some embodiments, the active channel region 310c has an active channel region width 316 between about 4 nm to about 30 nm. In some embodiments, at least one of the first active region 310a or the second active region 310b comprise at least one of a source or a drain. In some embodiments, a gate 312 is over the active channel region 310c. In some embodiments, such as illustrated in FIG. 16A, the channel portion 304c of the fin 304 and the active channel region 310c are tapered, where tapered refers to a fin having sidewalls lying within a plane oriented at an angle greater than about 1° relative to a line perpendicular to a surface of a substrate 302. In some embodiments, such as illustrated in FIG. 16B, the second active area 304b of the fin 304 and the second active region 310b are substantially vertical, where substantially vertical refers to a fin having sidewalls lying within a plane oriented at an angle between about 0° to about 1° relative to the line perpendicular to the surface of the substrate 302. In some embodiments, such as illustrated in FIG. 34B, the second active area 304b of the fin 304 and the second active region 310b are tapered. In some embodiments, the active channel region 310c having at least one of the active channel region height 318c between about 1 nm to about 50 nm or the active channel region width 316 has increased strain, such as increased tensile strain, as compared to an active channel region that has a height greater than the active channel region height 318c or a width greater than the active channel region width 316. In some embodiments, increased strain increases or enhances at least one of hole mobility or electron mobility in at least one of the first active region 310a, the active channel region 310c or the second active region 310b. In some embodiments, the active channel region 310c having at least one of the active channel region height 318c or the active channel region width 316 has decreased source drain leakage, as compared to an active channel region that has a height greater than the active channel region height 318c or a width greater than the active channel region width 316.

Figure 3:
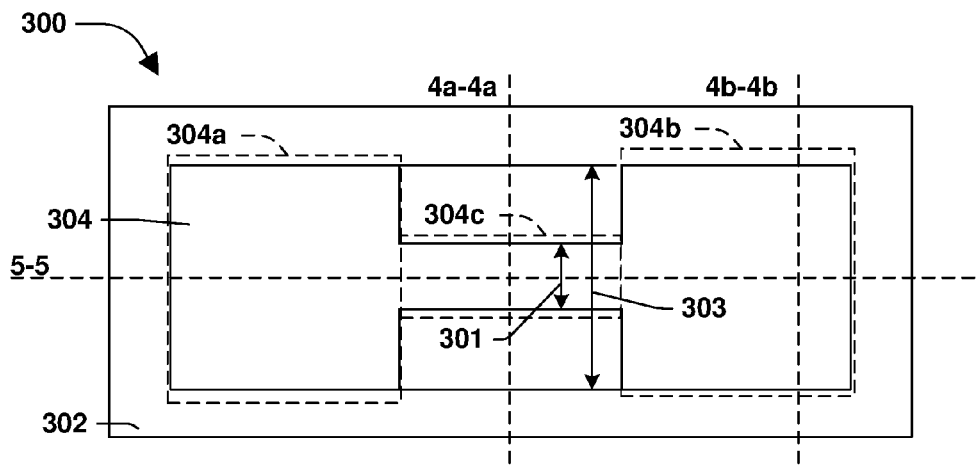
FIG. 3 is an illustration of a semiconductor device, in accordance with some embodiments.
Figures 4A, 4B:
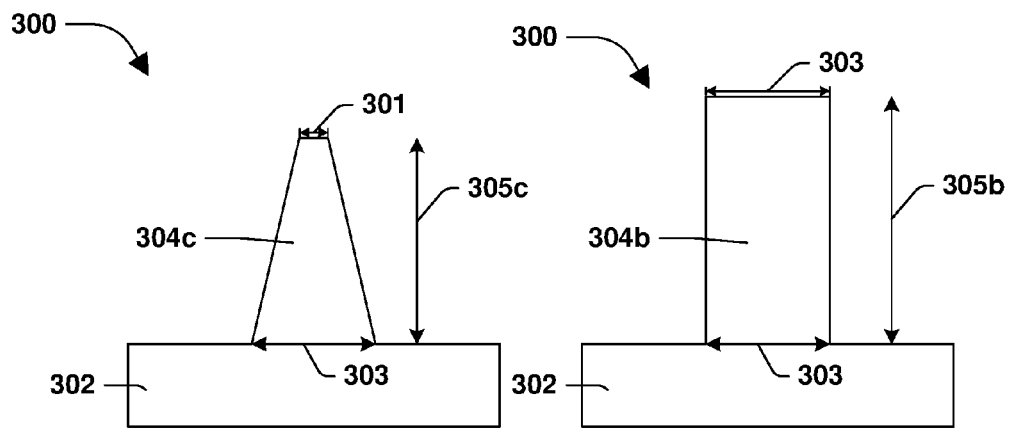
FIG. 4A is an illustration of a semiconductor device, in accordance with some embodiments.
FIG. 4B is an illustration of a semiconductor device, in accordance with some embodiments.
Figure 5:
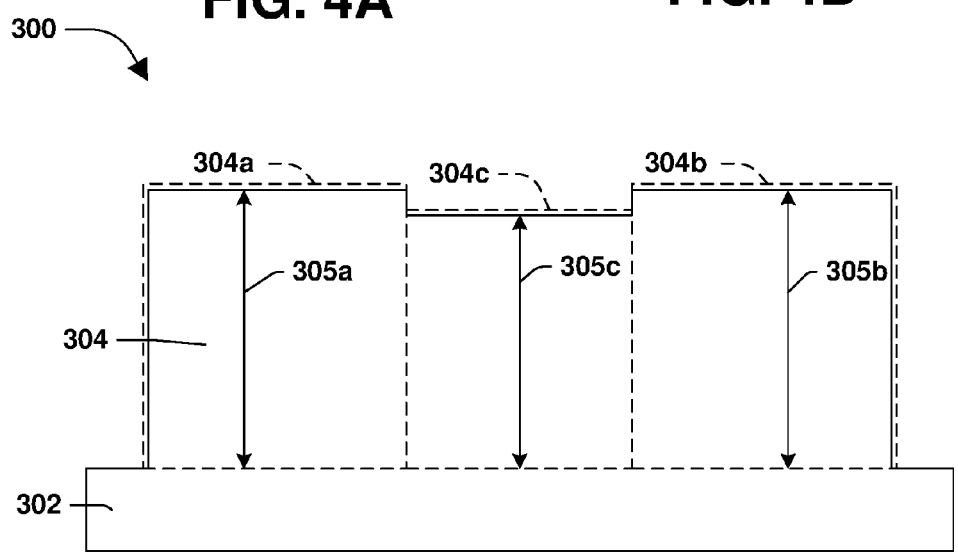
FIG. 5 is an illustration of a semiconductor device, in accordance with some embodiments.
Figure 6:
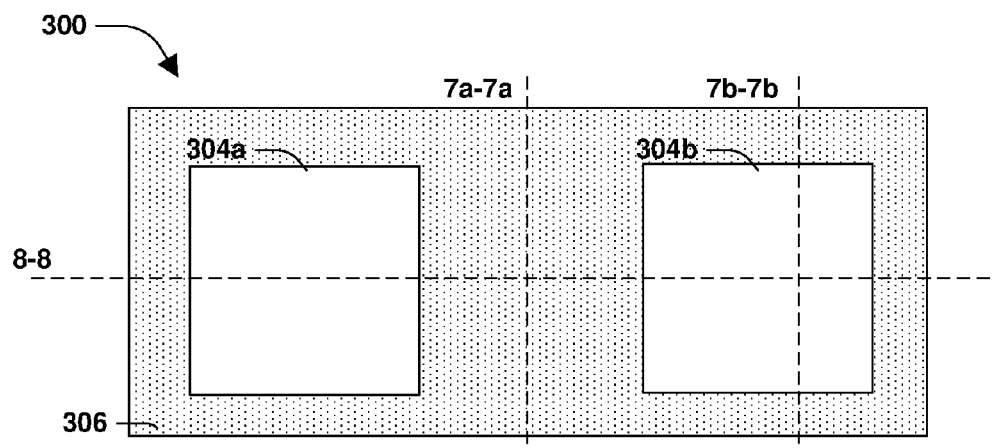
FIG. 6 is an illustration of a semiconductor device, in accordance with some embodiments.
Figures 7A, 7B:
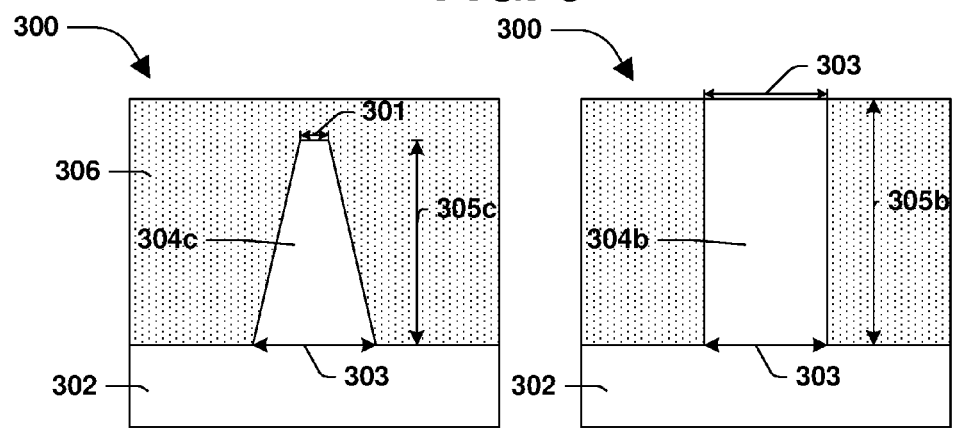
FIG. 7A is an illustration of a semiconductor device, in accordance with some embodiments.
FIG. 7B is an illustration of a semiconductor device, in accordance with some embodiments.
Figure 8:
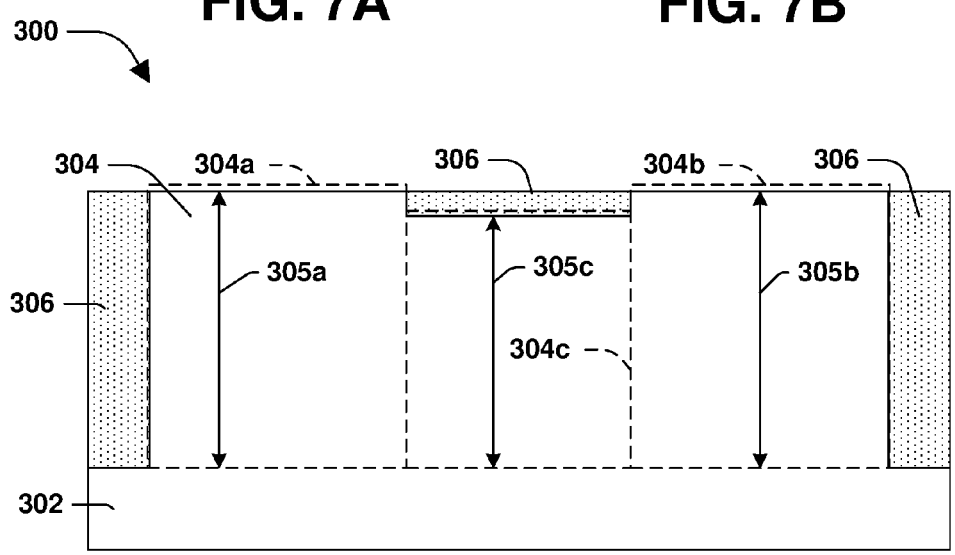
FIG. 8 is an illustration of a semiconductor device, in accordance with some embodiments.

At 102 of method 100, as illustrated in FIGS. 6, 7A, 7B and 8, a first dielectric layer 306 is formed over the channel portion 304c of the fin 304, such that the first active area 304a of the fin 304 and the second active area 304b of the fin 304 are exposed, according to some embodiments. In some embodiments, FIG. 6 illustrates an overview or top down view of the semiconductor device 300, FIGS. 7A and 7B illustrate a cross sectional view of the semiconductor device 300 taken along lines 7a-7a, and 7b-7b respectively, and FIG. 8 illustrates a cross sectional view of the semiconductor device 300 taken along a line 8-8. Turning to FIGS. 3, 4a, 4b, and 5, formed prior to FIGS. 7A, 7B and 8, where FIG. 3 illustrates an overview or top down view of the semiconductor device 300, FIGS. 4a and 4b illustrate a cross sectional view of the semiconductor device 300 taken along lines 4a-4a, and 4b-4b respectively, and FIG. 5 illustrates a cross sectional view of the semiconductor device 300 taken along a line 5-5. In some embodiments, the fin 304 is formed from the substrate 302. In some embodiments, the substrate 302 comprises an epitaxial layer, a silicon-on-insulator (SOI) structure, a wafer, or a die formed from a wafer, according to some embodiments. In some embodiments, the substrate 302 comprises at least one of silicon or germanium. In some embodiments, such as illustrated in FIG. 5, the fin 304 comprises the first active area 304a having a first height 305a, the channel portion 304c having a channel height 305c and the second active area 304b having a second height 305b. In some embodiments, at least one of the first height 305a or the second height 305b is greater than the channel height 305c. In some embodiments, such as illustrated in FIGS. 3, 4a and 4b, the channel portion 304c has a first bottom channel width 303 which is greater than a first top channel width 301 of the channel portion 304c. In some embodiments, the first active area 304a has a first bottom active width (not shown) which is substantially equal to a first top active width (not shown) of the first active area 304a. In some embodiments, the second active area 304b has a second bottom active width 303, which is substantially equal to a second top active width 303 of the second active area 304b. In some embodiments, the first bottom channel width 303, the first bottom active width (not shown), the first top active width (not shown), the second bottom active width 303 and the second top active width 303 are substantially equal. In some embodiments, the channel portion 304c of the fin 304 is tapered. In some embodiments, at least one of the first active area 304a or the second active area 304b are substantially vertical. In some embodiments, such as illustrated in FIGS. 7A, 7B and 8, the first dielectric layer 306 is deposited over the first active area 304a, the channel portion 304c and the second active area 304b. In some embodiments, portions of the first dielectric layer 306 are removed, such as by at least one of chemical mechanical planarization (CMP) or by selective etch, from a first active area top surface of the first active area 304a and a second active area top surface of the second active area 304b. In some embodiments, portions of the first dielectric layer 306 are removed, such as by patterning a photo resist over the first dielectric layer 306 such as by photolithography to mask of the first active area 304a of the fin 304 and the second active area 304b of the fin 304 and performing a selective etch.

Figure 9:
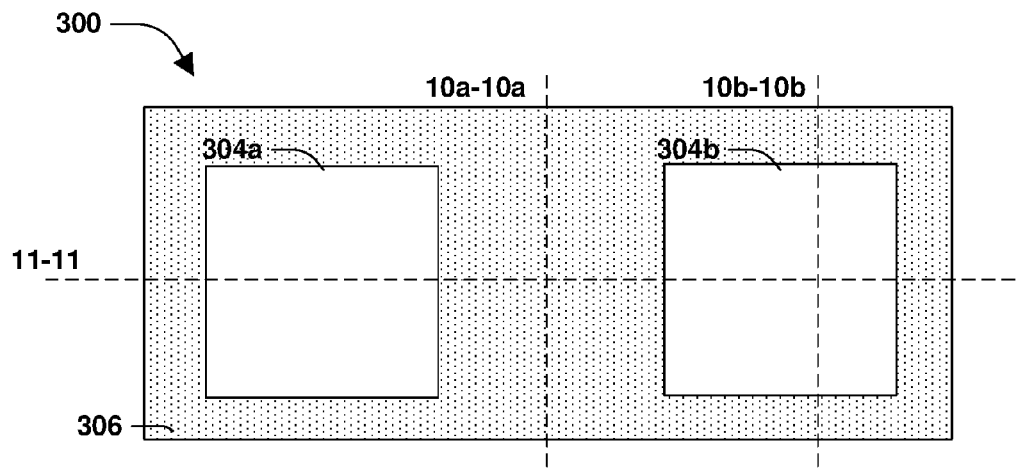
FIG. 9 is an illustration of a semiconductor device, in accordance with some embodiments.
Figures 10A, 10B:
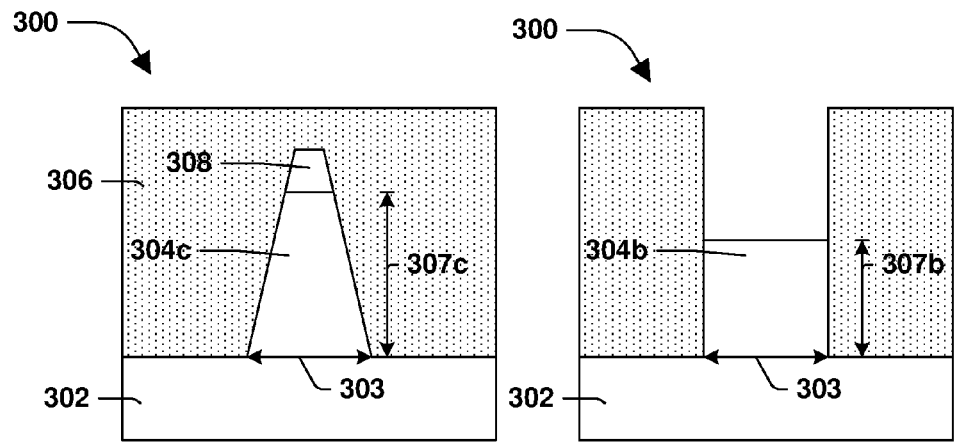
FIG. 10A is an illustration of a semiconductor device, in accordance with some embodiments.
FIG. 10B is an illustration of a semiconductor device, in accordance with some embodiments.
Figure 11:
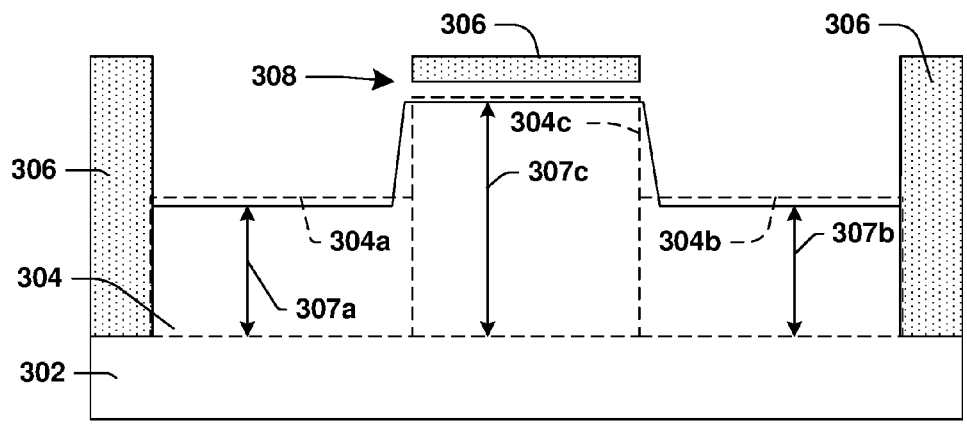
FIG. 11 is an illustration of a semiconductor device, in accordance with some embodiments.

At 104 of method 100, as illustrated in FIGS. 9, 10A, 10B and 11, the fin 304 is recessed such that the first height 305a of the first active area 304a, the channel height 305c of the channel portion 304c and the second height 305b of the second active area 304b are reduced, such that the first active area 304a has the first recessed height 307a, the second active area 304c has the second recessed height 307b, and the channel portion 304c has the recessed channel height 307c, according to some embodiments. In some embodiments, FIG. 9 illustrates an overview or top down view of the semiconductor device 300, FIGS. 10A and 10B illustrate a cross sectional view of the semiconductor device 300 taken along lines 10a-10a, and 10b-10b respectively, and FIG. 11 illustrates a cross sectional view of the semiconductor device 300 taken along a line 11-11. In some embodiments, the recessed channel height 307c is greater than the first recessed height 307a and the second recessed height 307b. In some embodiments, the first recessed height 307a is measured from a plane in which a bottom surface of the first dielectric layer 306 in contact with the substrate 302 lies to the first active area top surface of the first active area 304a. In some embodiments, the recessed channel height 307c is measured from the plane in which the bottom surface of the first dielectric layer 306 in contact with the substrate 302 lies to a channel top surface of the channel portion 304c. In some embodiments, the second recessed height 307b is measured from the plane in which the bottom surface of the first dielectric layer 306 in contact with the substrate 302 lies to the second active area top surface of the second active area 304b. In some embodiments, the fin 304 is recessed using a first etchant comprising HCl vapor. In some embodiments, such as illustrated in FIGS. 10A and 11, a void 308 is created by the recessing, such that the void 308 is defined by a bottom surface of the first dielectric layer 306 over the channel portion 304c and the channel top surface of the channel portion 304c.

Figure 12:
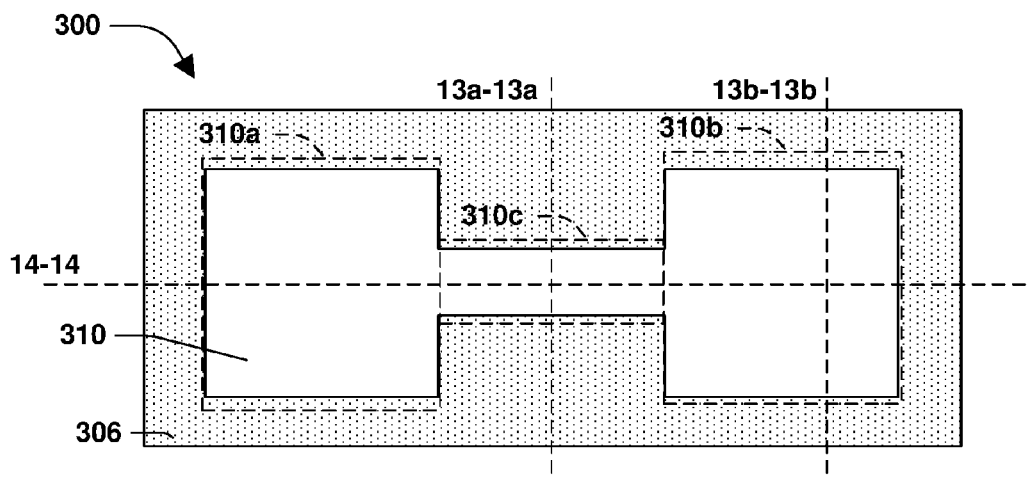
FIG. 12 is an illustration of a semiconductor device, in accordance with some embodiments.
Figures 13A, 13B:
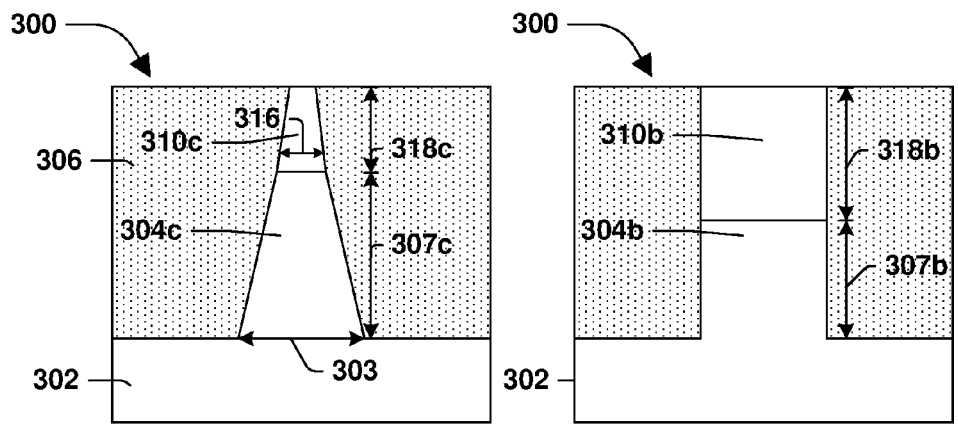
FIG. 13A is an illustration of a semiconductor device, in accordance with some embodiments.
FIG. 13B is an illustration of a semiconductor device, in accordance with some embodiments.
Figure 14:
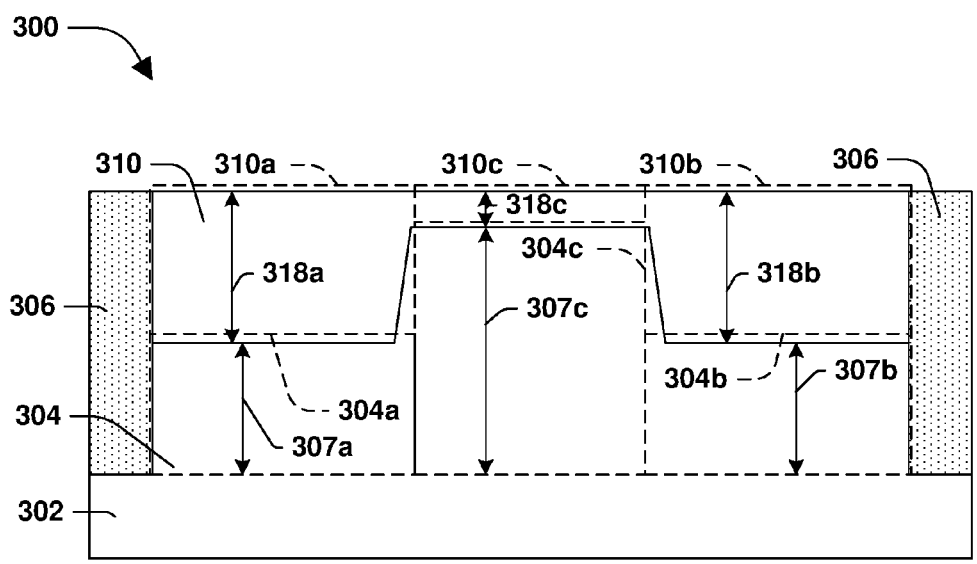
FIG. 14 is an illustration of a semiconductor device, in accordance with some embodiments.

At 106 of method 100, as illustrated in FIGS. 12, 13A, 13B and 14, the first active region 310a having the first active region height 318a is formed over the first active area 304a, the active channel region 310c having the active channel region height 318c is formed over channel portion 304c and the second active region 310b having the second active region height 318b is formed over second active area 304b, according to some embodiments. In some embodiments, FIG. 12 illustrates an overview or top down view of the semiconductor device 300, FIGS. 13A and 13B, illustrate a cross sectional view of the semiconductor device 300 taken along lines 13a-13a and 13b-13b respectively, and FIG. 14 illustrates a cross sectional view of the semiconductor device 300 taken along a line 14-14. In some embodiments, the first active region 310a has the first active region height 318a between about 10 nm to about 100 nm. In some embodiments, the active channel region 310c has the active channel region height 318c between about 1 nm to about 50 nm. In some embodiments, the second active region 310b has the second active region height 318b between about 10 nm to about 100 nm. In some embodiments, the first active region height 318a is measured from the first active area top surface of the first active area 304a to a first active region top surface of the first active region 310a. In some embodiments, the active channel region height 318c is measured from the channel top surface of the channel portion 304c to a channel region top surface of the active channel region 310c. In some embodiments, the second active region height 318b is measured from the second active area top surface of the second active area 304b to a second active region top surface of the second active region 310b. In some embodiments, an active layer 310 is formed over the first active area 304a, the channel portion 304c and the second active area 304b to form the first active region 310a, the active channel region 310c and the second active region 310b. In some embodiments, the active layer 310 comprises at least one of silicon, germanium, indium, arsenic, gallium, or antimony. In some embodiments, the active layer 310 is grown. In some embodiments, at least one of the first active region 310a or the second active region 310b comprise at least one of a source or a drain. In some embodiments, the first dielectric layer 306 over the active channel region 310c is removed by CMP. In some embodiments, the first dielectric layer 306 over the active channel region 310c is removed by CMP prior to the formation of the active layer 310. In some embodiments, excess active layer 310, such as active layer above a top surface of the first dielectric layer 306, is removed by at least one of CMP or selective etch. Turning to FIGS. 15, 16A, 16B and 17, where FIG. 15 illustrates an overview or top down view of the semiconductor device 300, FIGS. 16A and 16B illustrate a cross sectional view of the semiconductor device 300 taken along lines 16a-16a, and 16b-16b respectively, and FIG. 17 illustrates a cross sectional view of the semiconductor device 300 taken along a line 17-17. In some embodiments, the first dielectric layer 306 is recessed to expose a top portion of the first active region 310a, a top portion of the active channel region 310c and a top portion of the second active region 310b. In some embodiments, the gate 312 is formed over the active channel region 310c. In some embodiments, the gate 312 comprises a gate electrode comprising a conductive material over a gate dielectric material, the gate dielectric material in contact with the active channel region 310c. In some embodiments, sidewalls (not shown) are formed adjacent the gate 312.

According to some embodiments, the second method 200 of forming the semiconductor device 300 is illustrated in FIG. 2, and one or more semiconductor devices formed by such methodology are illustrated in FIGS. 18-35.

Figure 18:
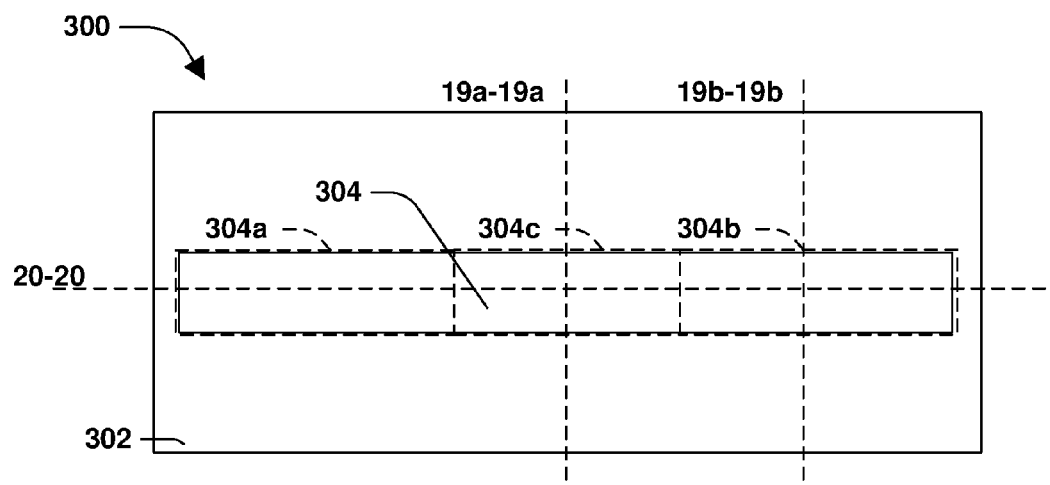
FIG. 18 is an illustration of a semiconductor device, in accordance with some embodiments.
Figures 19A, 19B:
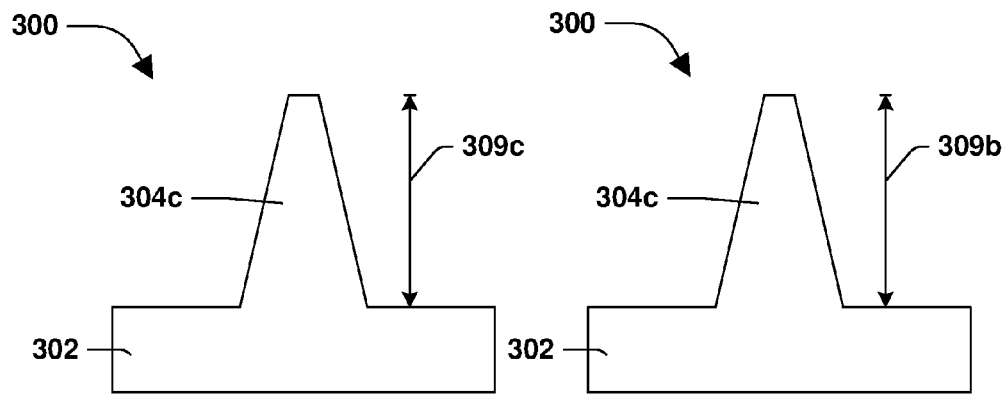
FIG. 19A is an illustration of a semiconductor device, in accordance with some embodiments.
FIG. 19B is an illustration of a semiconductor device, in accordance with some embodiments.
Figure 20:
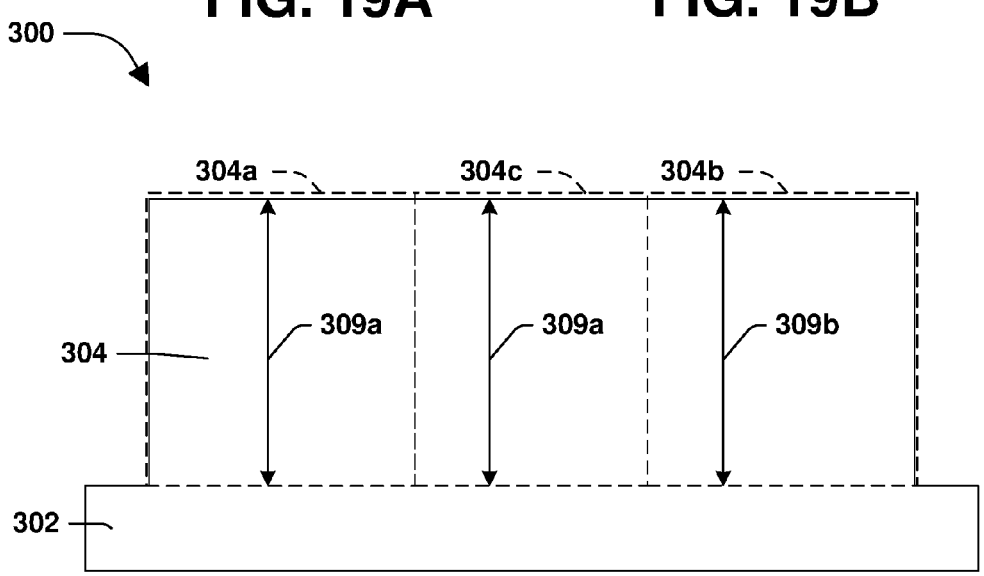
FIG. 20 is an illustration of a semiconductor device, in accordance with some embodiments.
Figure 21:
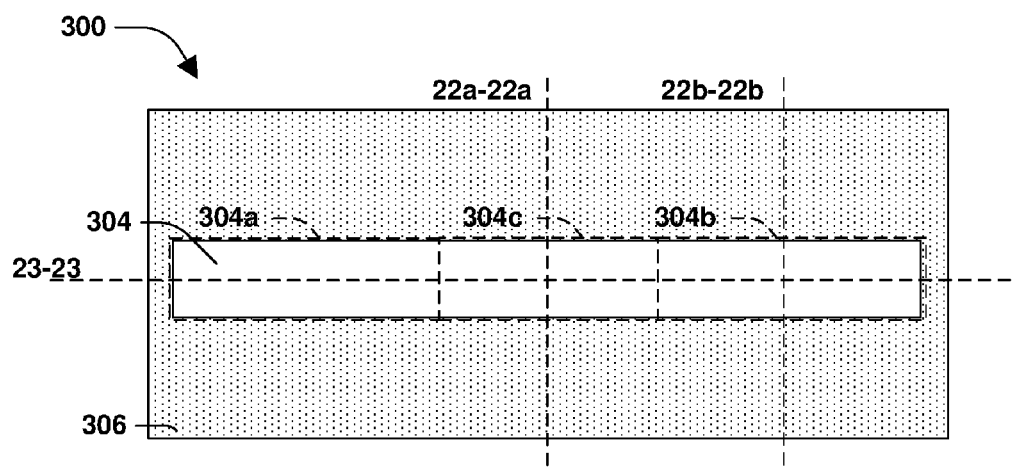
FIG. 21 is an illustration of a semiconductor device, in accordance with some embodiments.
Figures 22A, 22B:
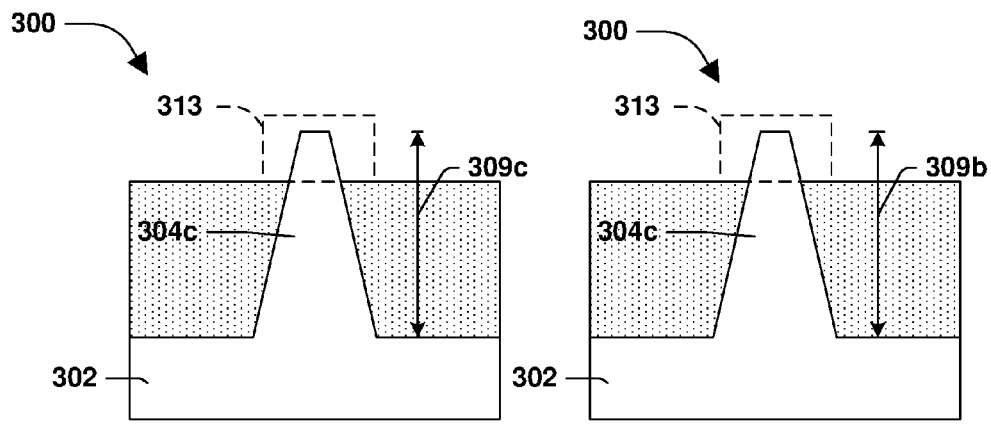
FIG. 22A is an illustration of a semiconductor device, in accordance with some embodiments.
FIG. 22B is an illustration of a semiconductor device, in accordance with some embodiments.
Figure 23:
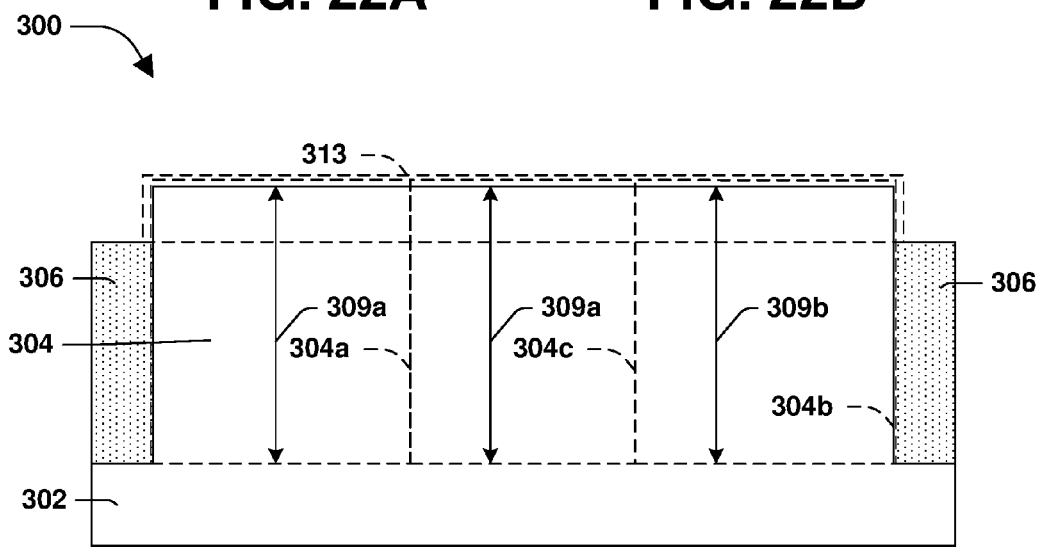
FIG. 23 is an illustration of a semiconductor device, in accordance with some embodiments.

At 202 of method 200, as illustrated in FIGS. 21, 22A, 22B and 23, the first dielectric layer 306 over the fin 304 is recessed, such that a top portion 313 of the fin 304 is exposed, according to some embodiments. In some embodiments, FIG. 21 illustrates an overview or top down view of the semiconductor device 300, FIGS. 22A and 22B illustrate a cross sectional view of the semiconductor device 300 taken along lines 22a-22a, and 22b-22b respectively, and FIG. 23 illustrates a cross sectional view of the semiconductor device 300 taken along a line 23-23. Turning to FIGS. 18, 19A, 19B, and 20, formed prior to FIGS. 21, 22A, 22B and 23, where FIG. 18 illustrates an overview or top down view of the semiconductor device 300, FIGS. 19A and 19B illustrate a cross sectional view of the semiconductor device 300 taken along lines 19a-19a and 19b-19b respectively, and FIG. 20 illustrates a cross sectional view of the semiconductor device 300 taken along a line 20-20. In some embodiments, the fin 304 is formed from the substrate 302. In some embodiments, the substrate 302 comprises an epitaxial layer, a silicon-on-insulator (SOI) structure, a wafer, or a die formed from a wafer, according to some embodiments. In some embodiments, the substrate 302 comprises at least one of silicon or germanium. In some embodiments, such as illustrated in FIG. 20, the fin 304 comprises the first active area 304a having a first height 309a, the channel portion 304c having a channel height 309c and the second active area 304b having a second height 309b. In some embodiments, the first height 309a, the channel height 309c and the second height 309b are substantially equal. In some embodiments, such as illustrated in FIGS. 18, 19A and 19B, the first active area 304a has a first bottom active width (not shown) which is substantially equal to a first top active width (not shown) of the first active area 304a. In some embodiments, the second active area 304b has a second bottom active width (not shown), which is substantially equal to a second top active width (not shown) of the first active area 304b. In some embodiments, at least one of the first active area 304a, the channel portion 304c, or the second active area 204b of the fin 304 are tapered. In some embodiments, at least one of the first active area 304a, the channel portion 304c, or the second active area 304b of the fin 304 are substantially vertical (not shown). In some embodiments, such as illustrated in FIGS. 21, 22A, 22B and 23, the first dielectric layer 306 is deposited over the first active area 304a, the channel portion 304c and the second active area 304b. In some embodiments, portions of the first dielectric layer 306 are removed, such as by at least one of chemical mechanical planarization (CMP) or by selective etch, from the top portion 313 of the fin 304. In some embodiments, portions of the first dielectric layer 306 are removed, such as by patterning a photo resist over the first dielectric layer 306 such as by photolithography to mask of the first active area 304a of the fin 304 and the second active area 304b of the fin 304 and performing a selective etch.

Figure 24:
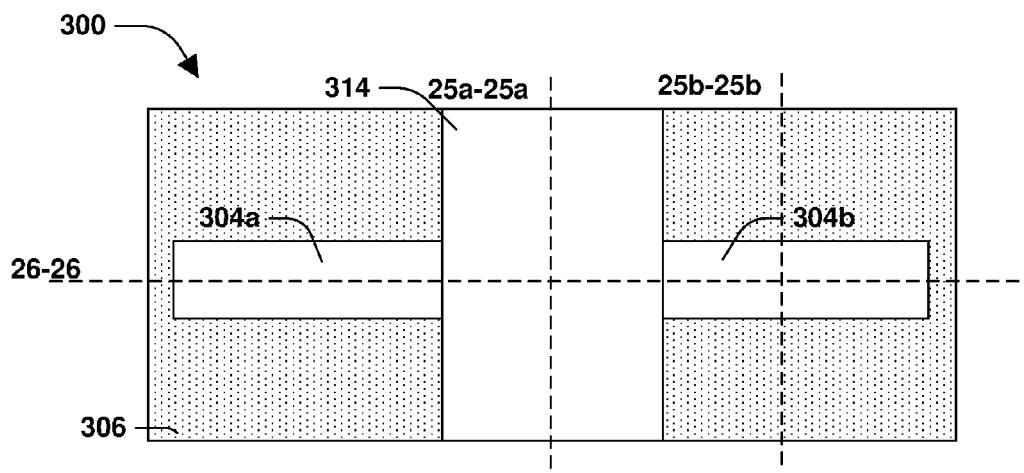
FIG. 24 is an illustration of a semiconductor device, in accordance with some embodiments.
Figures 25A, 25B:
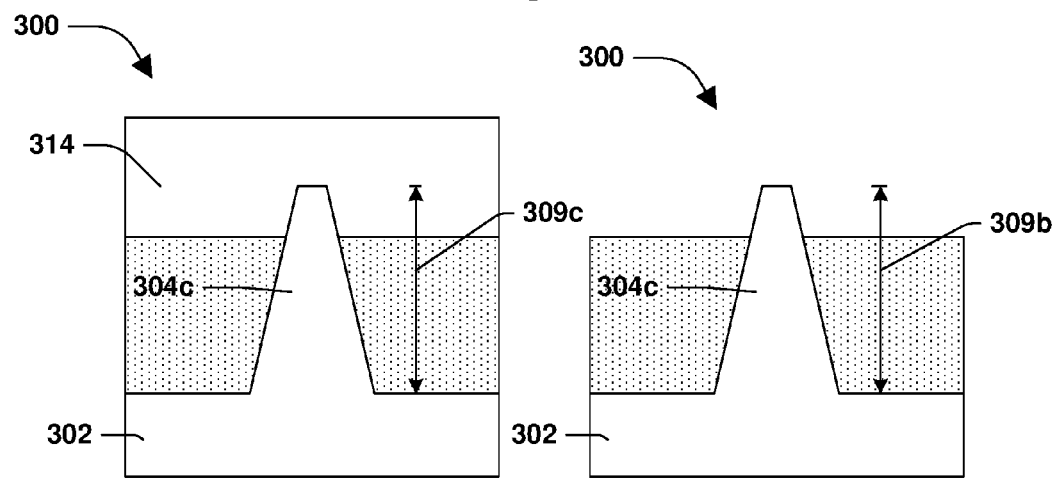
FIG. 25A is an illustration of a semiconductor device, in accordance with some embodiments.
FIG. 25B is an illustration of a semiconductor device, in accordance with some embodiments.
Figure 26:
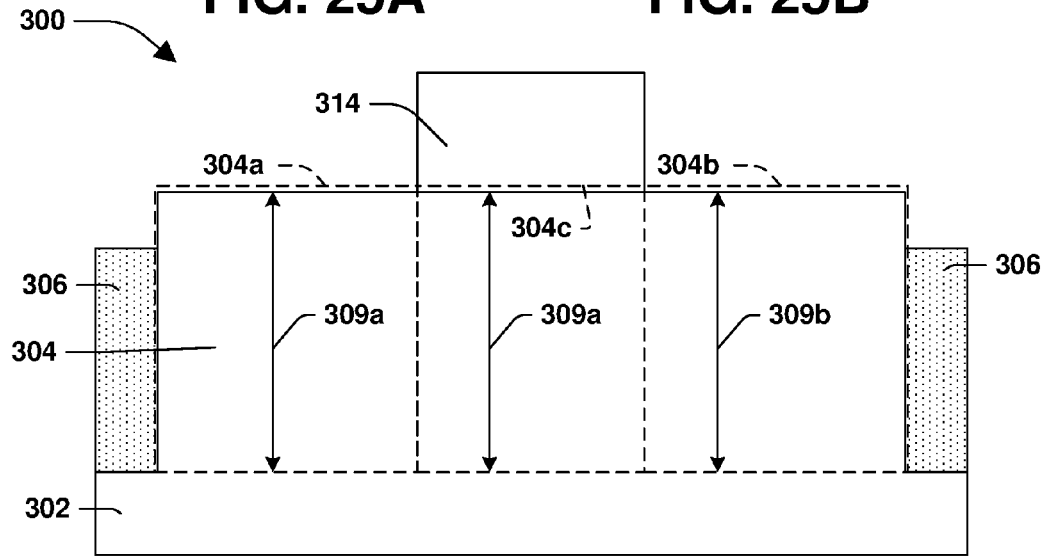
FIG. 26 is an illustration of a semiconductor device, in accordance with some embodiments.

At 204 of method 200, as illustrated in FIGS. 24, 25A, 25B and 26, a dummy gate 314 is formed over the channel portion 304c of fin 304, according to some embodiments. In some embodiments, FIG. 24 illustrates an overview or top down view of the semiconductor device 300, FIGS. 25A and 25B illustrate a cross sectional view of the semiconductor device 300 taken along lines 25a-25a and 25b-25b respectively, and FIG. 26 illustrates a cross sectional view of the semiconductor device 300 taken along a line 26-26. In some embodiments, the dummy gate 314 comprises an inert material.

Figure 27:
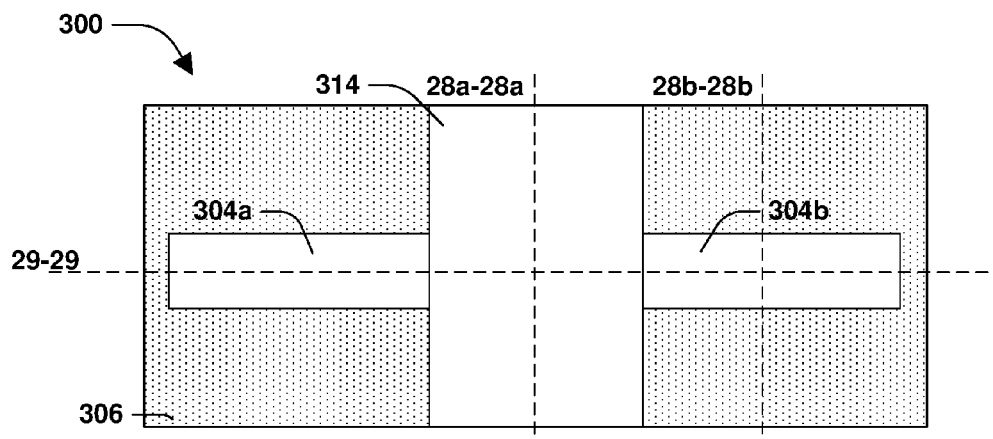
FIG. 27 is an illustration of a semiconductor device, in accordance with some embodiments.
Figures 28A, 28B:
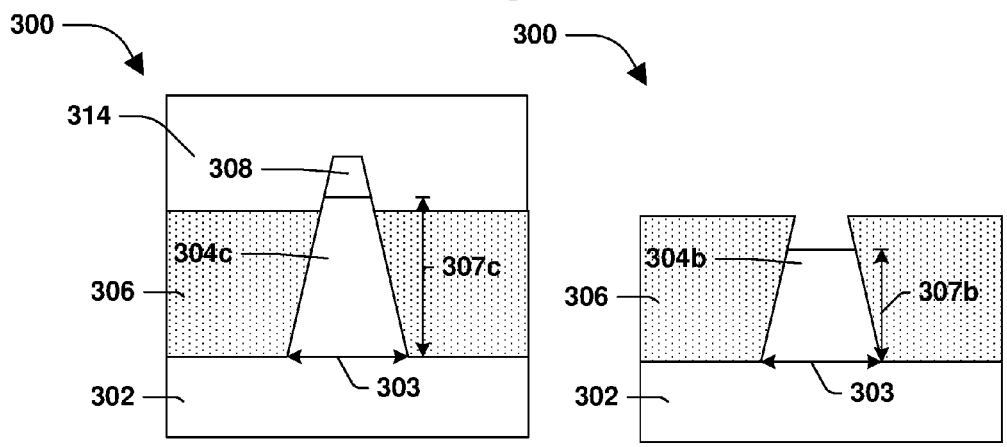
FIG. 28A is an illustration of a semiconductor device, in accordance with some embodiments.
FIG. 28B is an illustration of a semiconductor device, in accordance with some embodiments.
Figure 29:
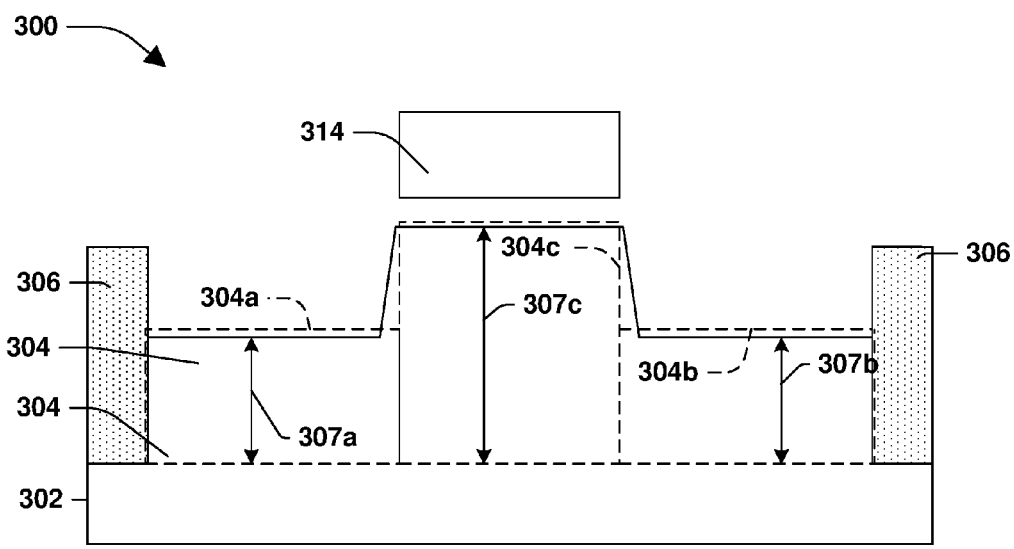
FIG. 29 is an illustration of a semiconductor device, in accordance with some embodiments.

At 206 of method 200, as illustrated in FIGS. 27, 28A, 28B and 29, the fin 304 is recessed such that the first height 309a of the first active area 304a, the channel height 309c of the channel portion 304c and the second height 309b of the second active area 304b are reduced, such that the first active area 304a has the first recessed height 307a, the second active area 304c has the second recessed height 307b, and the channel portion 304c has the recessed channel height 307c, according to some embodiments. In some embodiments, FIG. 27 illustrates an overview or top down view of the semiconductor device 300, FIGS. 28A and 28B illustrate a cross sectional view of the semiconductor device 300 taken along lines 28a-28a and 28b-28b respectively, and FIG. 29 illustrates a cross sectional view of the semiconductor device 300 taken along a line 29-29. In some embodiments, the first active area 304a, the channel portion 304c and the second active area 304b are formed in the same manner as described above with regard to the first active area 304a, the channel portion 304c and the second active area 304b as illustrated in FIGS. 9, 10A, 10B and 11. In some embodiments, such as illustrated in FIGS. 28A and 29, a void 308 is created by the recessing, such that the void 308 is defined by a bottom surface of the dummy gate 314 and the channel top surface of the channel portion 304c.

Figure 30:
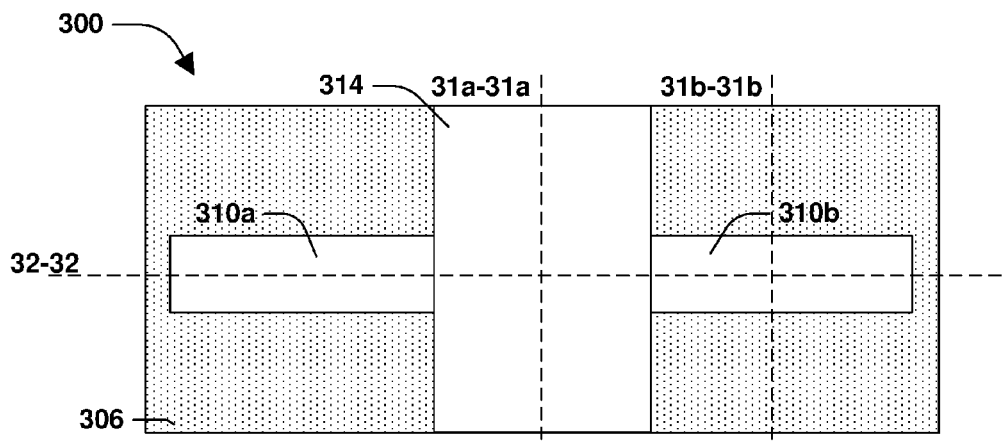
FIG. 30 is an illustration of a semiconductor device, in accordance with some embodiments.
Figure 31A:
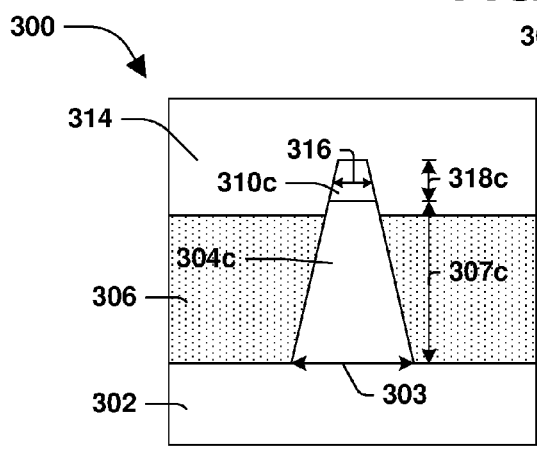
FIG. 31A is an illustration of a semiconductor device, in accordance with some embodiments.
Figure 31B:
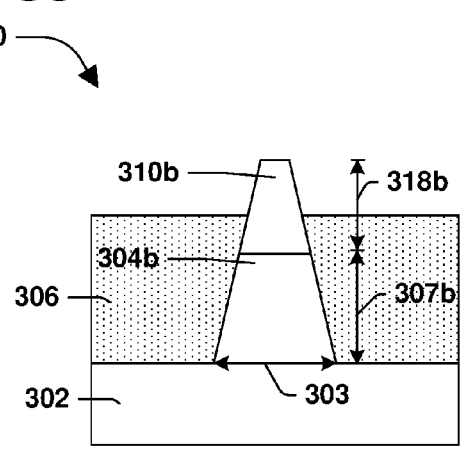
FIG. 31B is an illustration of a semiconductor device, in accordance with some embodiments.
Figure 32:
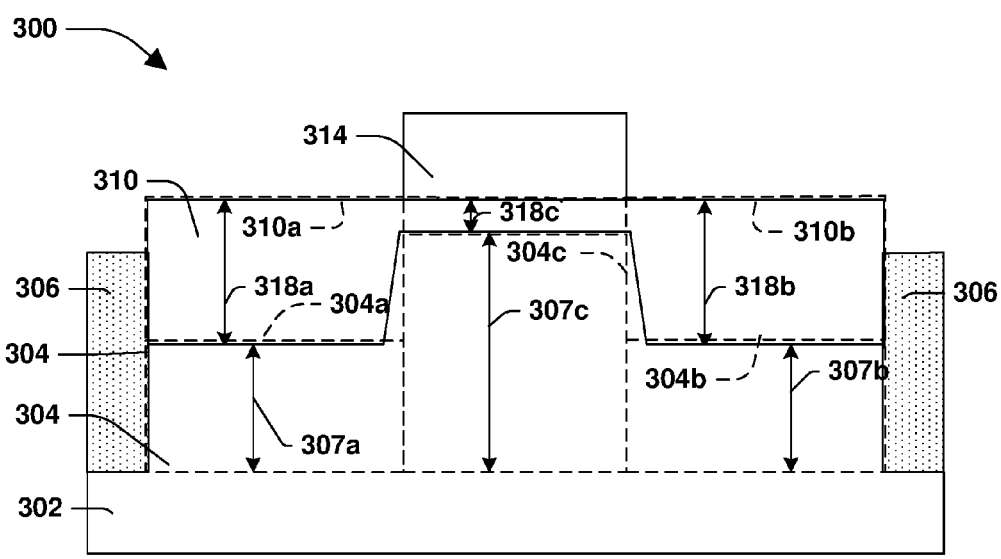
FIG. 32 is an illustration of a semiconductor device, in accordance with some embodiments.

At 208 of method 200, as illustrated in FIGS. 30, 31A, 31B and 32, the first active region 310a having the first active region height 318a is formed over the first active area 304a, the active channel region 310c having the active channel region height 318c is formed over channel portion 304c and the second active region 310b having the second active region height 318b is formed over second active area 304b, according to some embodiments. In some embodiments, FIG. 30 illustrates an overview or top down view of the semiconductor device 300, FIGS. 31A and 31B illustrate a cross sectional view of the semiconductor device 300 taken along lines 31a-31a and 31b-31b respectively, and FIG. 32 illustrates a cross sectional view of the semiconductor device 300 taken along a line 32-32. In some embodiments, the first active region 310a, the active channel region 310c and the second active region 310b are formed in the same manner described above with regard to the first active region 310a, the active channel region 310c and the second active region 310b as illustrated in FIGS. 12, 13A, 13B and 14. Turning to FIGS. 33, 34A, 34B and 35, where FIG. 33 illustrates an overview or top down view of the semiconductor device 300, FIGS. 34A and 34B illustrate a cross sectional view of the semiconductor device 300 taken along lines 34a-34a and 34b-34b respectively, and FIG. 35 illustrates a cross sectional view of the semiconductor device 300 taken along a line 35-35. In some embodiments, the dummy gate 314 is removed to expose the channel top surface of the active channel region 310c. In some embodiments, the gate 312 is formed over the active channel region 310c. In some embodiments, the gate 312 comprises the gate electrode comprising the conductive material over the gate dielectric material, the gate dielectric material in contact with the active channel region. In some embodiments, sidewalls (not shown) are formed adjacent the gate 312. In some embodiments, the active channel region 310c having at least one of the active channel region height 318c or the active channel region width 316 has increased strain, such as increased tensile strain, as compared to an active channel region that has a height greater than the active channel region height 318c or a width greater than the active channel region width 316. In some embodiments, increased strain increases or enhances at least one of hole mobility or electron mobility in at least one of the first active region 310a, the active channel region 310c or the second active region 310b. In some embodiments, the active channel region 310c having at least one of the active channel region height 318c or the active channel region width 316 has decreased source drain leakage, as compared to an active channel region that has a height greater than the active channel region height 318c or a width greater than the active channel region width 316.

According to some embodiments, a method of forming semiconductor device comprises forming a first dielectric layer over a channel portion of a fin such that a first active area of the fin and a second active area of the fin are exposed and recessing the fin, such that a first height of the first active area, a channel height of the channel portion and a second height of the second active area are reduced, such that the first active area has a first recessed height, the second active area has a second recessed height, and the channel portion has recessed channel height, the recessed channel height greater than the first recessed height and greater than the second recessed height. According to some embodiments, the method of forming semiconductor device comprises forming a first active region over the first active area, the first active region having a first active region height, forming an active channel region over the channel portion, the active channel region having an active channel region height and forming a second active region over the second active area, the second active region having a second active region height. In some embodiments, the first active region height and the second active region height are greater than the active channel region height.

According to some embodiments, a method of forming semiconductor device comprises recessing a first dielectric layer over a fin, such that a top portion of the fin is exposed, the fin comprising a first active area, a channel portion and a second active area and forming a dummy gate over the channel portion of the fin. According to some embodiments, the method of forming semiconductor device comprises recessing the fin, such that a first height of the first active area, a channel height of the channel portion and a second height of the second active area are reduced, such that the first active area has a first recessed height, the second active area has a second recessed height, and the channel portion has recessed channel height, the recessed channel height greater than the first recessed height and greater than the second recessed height. According to some embodiments, the method of forming semiconductor device comprises forming a first active region over the first active area, the first active region having a first active region height, forming an active channel region over the channel portion, the active channel region having an active channel region height and forming a second active region over the second active area, the second active region having a second active region height. In some embodiments, the first active region height and the second active region height are greater than the active channel region height.

According to some embodiments, a semiconductor device comprises a fin having a first active area and a channel portion, where the first active area has a first recessed height and the channel portion has a recessed channel height, the recessed channel height greater than the first recessed height. In some embodiments, a first active region is over the first active area, the first active region having a first active region height and an active channel region is over the channel portion, the active channel region having an active channel region height, where the first active region height is greater than the active channel region height.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor device comprising:
   forming a first dielectric layer over a channel portion of a fin, wherein a first active area of the fin and a second active area of the fin are exposed after the first dielectric layer is formed;
   etching the fin while the first dielectric layer is over the channel portion of the fin, wherein after the etching:
      the first active area of the fin has a first height,
      the second active area of the fin has a second height, and
      the channel portion of the fin has a third height greater than the first height and greater than the second height;
   forming a first active region over the first active area of the fin, wherein the first active region has a first active region height;
   forming an active channel region over the channel portion of the fin, wherein the active channel region has an active channel region height;
   forming a second active region over the second active area of the fin, wherein:
      the second active region has a second active region height, and
      the first active region height and the second active region height are greater than the active channel region height; and
   forming a gate over the active channel region, wherein the gate is in contact with a sidewall of the active channel region.

2. The method of claim 1, wherein a void is defined between the channel portion of the fin and the first dielectric layer upon the fin being etched.

3. The method of claim 1, comprising:
   removing a portion of the first dielectric layer overlying the channel portion of the fin after etching the fin.

4. The method of claim 1, comprising:
   planarizing the first active region, the active channel region, and the second active region prior to forming the gate.

5. The method of claim 1, wherein a top surface of the first active region, a top surface of the active channel region, and a top surface of the second active region lie in a same first plane after planarizing the first active region, the active channel region, and the second active region.

6. The method of claim 1, comprising:
   removing a portion of the first dielectric layer in contact with the sidewall of the active channel region prior to forming the gate.

7. The method of claim 1, wherein forming the gate comprises:
   forming a gate dielectric over the active channel region, wherein the gate dielectric is in contact with the sidewall of the active channel region, and
   forming a gate electrode over the gate dielectric.

8. The method of claim 1, comprising forming the fin from a substrate prior to forming the first dielectric layer, wherein upon the fin being formed:
   the first active area of the fin has a fourth height greater than the first height,
   the second active area of the fin has a fifth height greater than the second height,
   the channel portion of the fin has a sixth height greater third height but less than the first height and the second height.

9. The method of claim 1, wherein the sidewall of the active channel region is tapered.

10. The method of claim 1, wherein forming the first active region and the second active region comprises:
    growing the first active region and the second active region.

11. The method of claim 1, wherein etching the fin comprises:
    performing a first etch using hydrochloric vapor.

12. The method of claim 1, comprising:
    recessing a portion of the first dielectric layer in contact with the first active region after forming the gate to expose a portion of a sidewall of the first active region.

13. A method of forming a semiconductor device comprising:
    forming a first dielectric layer over a channel portion of a fin while the channel portion of the fin has a first height and an active area of the fin has a second height greater than the first height;
    etching the fin, wherein after the etching the channel portion of the fin has a third height and the active area of the fin has a fourth height less than the third height due to the first dielectric layer being disposed over the channel portion of the fin during the etching;
    forming an active region over the active area, wherein the active region has a first active region height;
    forming an active channel region over the channel portion of the fin, wherein the active channel region has an active channel region height less than the first active region height; and
    forming a gate over the active channel region, wherein the gate is in contact with a sidewall of the active channel region.

14. The method of claim 13, wherein a top surface of the active area of the fin is exposed after forming the first dielectric layer.

15. The method of claim 14, wherein a top surface of the channel portion of the fin is concealed after forming the first dielectric layer.

16. The method of claim 13, wherein a void is defined between a bottom surface of the first dielectric layer and a top surface of the channel portion after etching the fin.

17. The method of claim 13, wherein forming the active region comprises:
    growing the active region.

18. The method of claim 13, comprising:
    removing a portion of the first dielectric layer in contact with the sidewall of the active channel region prior to forming the gate.

19. A method of forming a semiconductor device comprising:
    forming a first dielectric layer over a channel portion of a fin;
    etching the fin to define a void between a bottom surface of the first dielectric layer and a top surface of the channel portion of the fin;
    removing a portion of the first dielectric layer over the void;
    forming an active channel region where the void is defined; and forming a gate over the active channel region, wherein the gate is in contact with a sidewall of the active channel region.

20. The method of claim 19, wherein etching the fin comprises:
   etching the channel portion of the fin at a slower rate than an active area of the fin.

21. The method of claim 19, wherein after etching the fin, the channel portion of the fin has a first height and an active area of the fin has a second height less than the first height.

* * * * *